(12) United States Patent
Eshun

(10) Patent No.: US 12,713,685 B2
(45) Date of Patent: Aug. 18, 2026

(54) METHOD AND STRUCTURE FOR REDUCED SUBSTRATE LOSS FOR GaN DEVICES

(71) Applicant: TEXAS INSTRUMENTS INCORPORATED, Dallas, TX (US)

(72) Inventor: Ebenezer Eshun, Frisco, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 736 days.

(21) Appl. No.: 18/148,754

(22) Filed: Dec. 30, 2022

(65) Prior Publication Data

US 2024/0222365 A1 Jul. 4, 2024

(51) Int. Cl.

| | |
|---|---|
| ***H10D 84/01*** | (2026.01) |
| ***H10D 1/20*** | (2025.01) |
| ***H10D 84/05*** | (2025.01) |

(52) U.S. Cl.

CPC ............... *H10D 84/01* (2025.01); *H10D 1/20* (2025.01); *H10D 84/05* (2025.01)

(58) Field of Classification Search

CPC ..................................................... H01L 21/764

See application file for complete search history.

(56) References Cited

U.S. PATENT DOCUMENTS

| | | | | |
|---|---|---|---|---|
| 2005/0139952 A1* | 6/2005 | Koh | H01L 21/76232 | 257/E21.549 |
| 2009/0148998 A1* | 6/2009 | Tischler | H01L 21/76232 | 257/E21.573 |
| 2009/0149009 A1* | 6/2009 | Tischler | H01L 21/76232 | 438/700 |
| 2014/0231874 A1* | 8/2014 | Hoshi | H10D 30/4755 | 257/194 |
| 2015/0137135 A1* | 5/2015 | Green | H10D 8/60 | 438/237 |
| 2015/0263114 A1* | 9/2015 | Nakazawa | H10B 41/47 | 257/315 |
| 2016/0284814 A1* | 9/2016 | Grivna | H10D 12/032 | |
| 2017/0084705 A1* | 3/2017 | Grivna | H10D 62/115 | |
| 2017/0148905 A1* | 5/2017 | Tipirneni | H10D 84/01 | |
| 2023/0282645 A1* | 9/2023 | Wohlmuth | H01L 23/02 | 257/194 |

* cited by examiner

*Primary Examiner* — Erik Kielin

(74) *Attorney, Agent, or Firm* — Andrew R. Ralston; Frank D. Cimino

(57) ABSTRACT

An integrated circuit includes a GaN layer located over a semiconductor substrate. The GaN layer includes an active device region of the GaN layer having a first conductivity and a passive device region of the GaN layer having a smaller second conductivity. A transistor may be located over the GaN layer in the active device region, and a passive device may be located over the GaN layer in the passive device region.

18 Claims, 12 Drawing Sheets

PLAN VIEW HERE

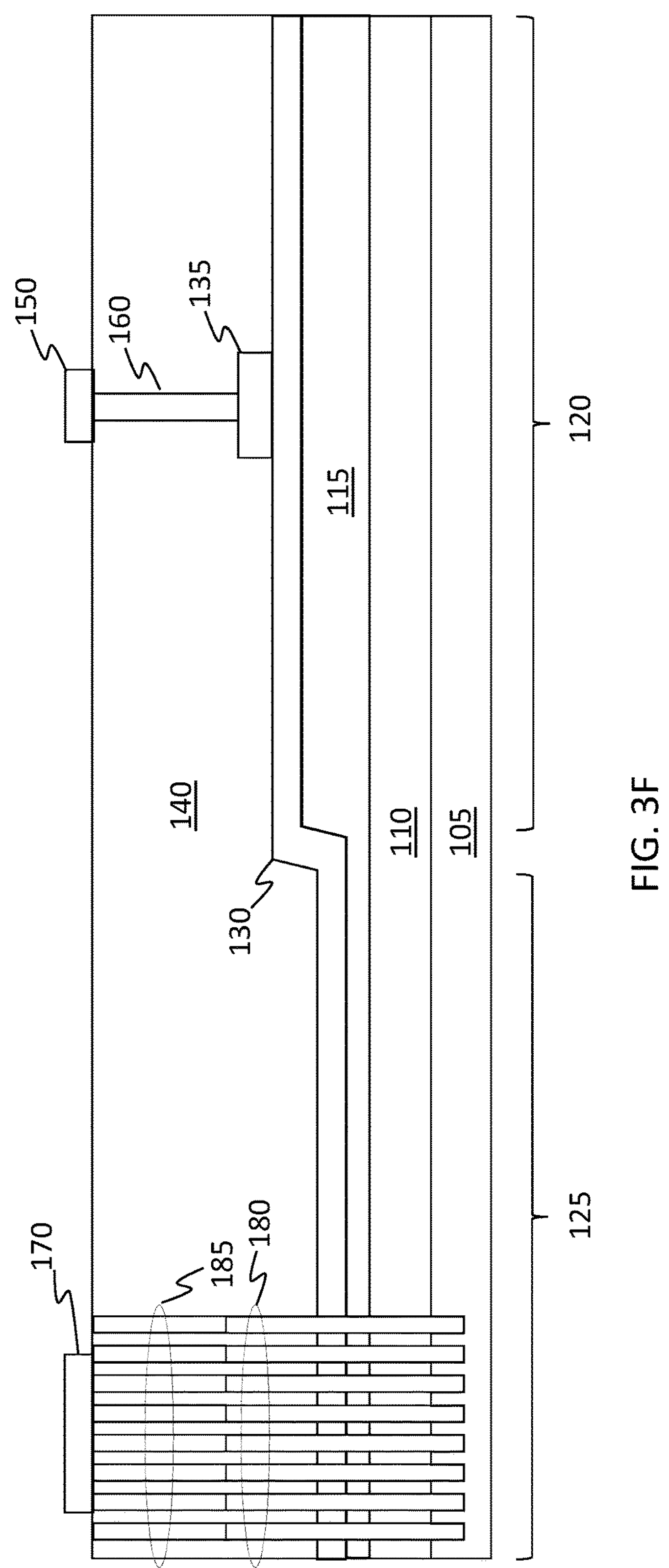
FIG. 3F

100
345
350
340
170
185
180
150
160
135
145
140
130
115
110
105
120
125

METHOD AND STRUCTURE FOR REDUCED SUBSTRATE LOSS FOR GaN DEVICES

FIELD

This disclosure relates to the field of semiconductor manufacturing, and more particularly, but not exclusively, to reducing coupling between a passive device and an underlying semiconductor substrate.

BACKGROUND

Gallium nitride (GaN) devices are increasingly employed in various electronic devices. As such devices enter mainstream use, integration of various components may be challenging.

SUMMARY

The inventors disclose various devices and methods related to integrated circuits that include a passive device and an active device over a transistors segmented transistors that are expected to operate with greater temperature uniformity relative to baseline transistor configurations.

In one example an integrated circuit includes a GaN layer located over a semiconductor substrate. The GaN layer includes an active device region of the GaN layer having a first conductivity and a passive device region of the GaN layer having a smaller second conductivity. A transistor may be located over the GaN layer in the active device region, and a passive device may be located over the GaN layer in the passive device region.

Other examples include methods of manufacturing integrated circuit devices according to the integrated circuit described above.

BRIEF DESCRIPTION OF THE VIEWS OF THE DRAWINGS

FIGS. 3A-3J illustrate in section view various stages of manufacturing the integrated circuit of FIG. 1 according to various examples.

DETAILED DESCRIPTION

The present disclosure is described with reference to the attached figures. The figures are not necessarily drawn to scale, and they are provided without implied limitation to illustrate various described examples. Several aspects of the disclosure are described below with reference to example applications for illustration. It should be understood that numerous specific details, relationships, and methods are set forth to provide an understanding of the disclosure. The present disclosure is not limited by the illustrated ordering of acts or events unless stated otherwise, as some acts may occur in different orders and/or concurrently with other acts or events. Furthermore, all illustrated acts or events may not be required to implement a methodology in accordance with the present disclosure.

Various disclosed methods and devices of the present disclosure may be beneficially applied to integrated circuits by reducing coupling between a passive component and the substrate. While such examples may be expected to improve performance of such circuits, e.g. by reducing coupling losses, no particular result is a requirement of the present invention unless explicitly recited in a particular claim.

Figure 1:
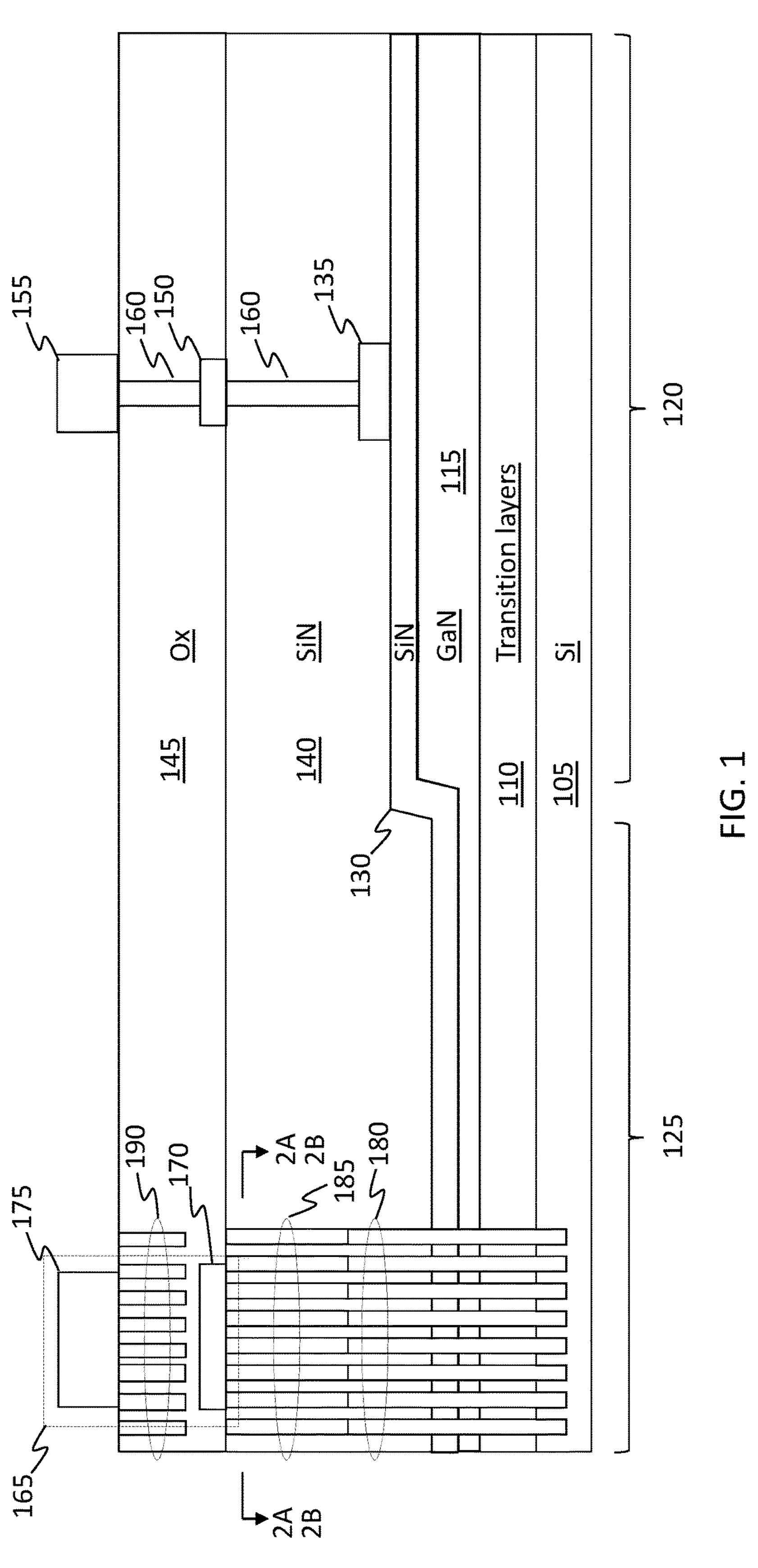
FIG. 1 illustrates in section view an example integrated circuit of the disclosure having a reduced-coupling region including voids in a dielectric layer.

FIG. 1 illustrates a section view of an integrated circuit (IC) 100 according to various examples. The IC 100 includes a substrate 105, e.g. a silicon substrate. A transition layer 110 is located between a GaN layer 115 and the substrate 105. The transition layer 115 may include two or more sublayers, e.g. including GaAlN, that may buffer a lattice mismatch between the substrate 105 and the GaN layer 115. The IC 100 includes a device area 120 and an isolation area 125. In the device area the GaN layer 115 includes one or more mesas over which active devices, e.g. transistors, may be formed, exemplified by an active device 135. The isolation area 125 includes a valley in which the thickness of the GaN layer 115 is reduced, thereby electrically separating the isolation area 125 from a conductive layer, e.g. a 2-dimensional electron gas (2 DEG), in the device area 120.

A first SiN layer 130 conformally covers the GaN layer 115, and may act as a gate dielectric layer for the active device 135. A second SiN layer 140 covers the first SiN layer 130 and the active device 135, and a dielectric layer 145, e.g. a silicon oxide layer, covers the SiN layer 140. A first metal level interconnect 150, a second metal level interconnect 155, and vias (vertical interconnects) 160 are representative of connectivity between the active device 135 and other components of the IC 100.

A passive device 165 is located in the isolation area 125. The passive device 165 includes a lower metal structure 170 and an upper metal structure 175. In some examples the passive device 165 may be an inductor, in which examples the lower metal structure 170 may be a lower winding and the upper metal structure 175 may be an upper winding. In some other examples the passive device 165 may be a capacitor, in which examples the lower metal structure 170 may be a lower electrode or plate, and the upper metal structure 175 may be an upper electrode or plate. The lower metal structure 170 and the upper metal structure 175 are spaced apart by the dielectric layer 145. One of the metal structures 170, 175 may be energized by a time-varying signal, e.g. by the active device 135, thereby coupling via an induced time-varying electric or magnetic field to the other of the metal structures 170, 175. The passive device 165 may thus provide an electro-magnetic component that acts in cooperation with active devices exemplified by the active device 135 to implement an electrical function of the IC 100.

The IC 100 includes voids 180 formed in the isolation area 125. The voids 180 are defined by the removal of portions of one or more material layers between the passive device 165 and the substrate 105. Additional aspects of the voids 180 are described below. Dielectric plugs 185 partially fill the voids 180 and extend to a top surface of the SiN layer 140. As illustrated in the current example dielectric plugs 190 may partially fill the dielectric layer 145.

The passive device 165 is coupled, e.g. by electromagnetic fields, to the GaN layer 115, the transition layers 110 and the substrate 105. The coupling is in part a function of the dielectric permittivity of these materials. Silicon nitride may have a relative dielectric constant between 7 and 10, and GaN may have a relative dielectric constant of about 9. Moreover, both materials may have nontrivial loss components of the dielectric permittivity. These effects may result in undesirable coupling of the passive device 165 to the substrate 105 and/or losses that may decrease fidelity of a signal related to the passive device 165.

The effect of the layers 110, 115, 130 and 140 may be reduced by removing a portion of these layers by forming the voids 180. Those portions of the voids 180 that are unfilled will have a relative dielectric permittivity of about unity. Those portions of the voids that are filled by the plugs 185 will have a relative dielectric permittivity greater than unity. In one example the plugs 185 are formed from a plasma-deposited silicon oxide and have relative dielectric permittivity of about 3.5. In another example, the plugs 185 include a spin-on glass such as hydrogen-silsesquioxane (HSQ) or methyl-silsesquioxane (MSQ), which respectively have a relative dielectric permittivity of about 3.1 and 2.9. While any dielectric material used to form the plugs 185 will have a dielectric permittivity greater than unity, the relative dielectric permittivity is less than the relative dielectric permittivity of the SiN layer 140. The reduction of the average local relative dielectric permittivity between the passive device 165 and the substrate 105 is expected to reduce the undesirable coupling between the substrate 105 and the passive device 165. Further reduction of loss processes may result from impeding current flow through the GaN layer 115 effectively reducing the conductivity of that layer.

Figure 2B:
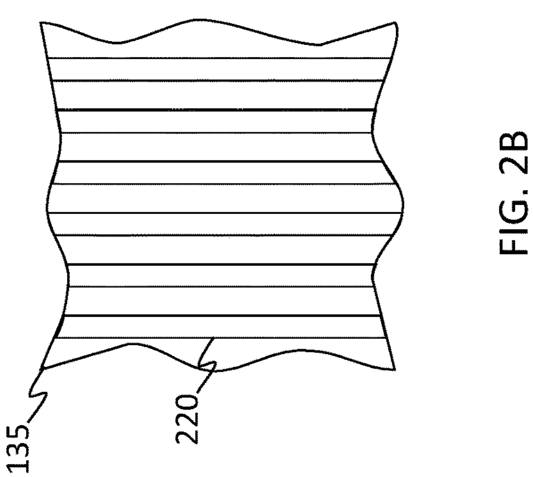
FIGS. 2A and 2B illustrate example geometries of the voids of FIG. 1.
Figure 2A:
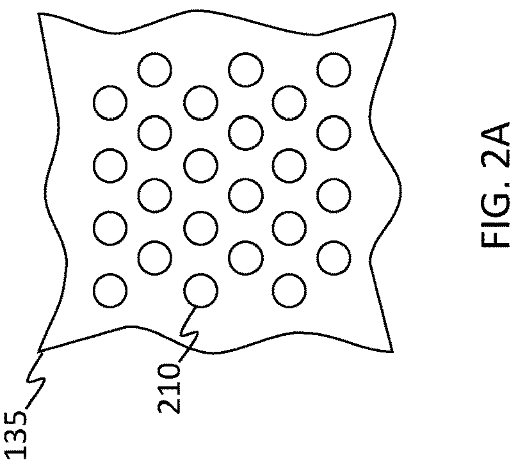

While the voids 180 are not limited to any particular geometry, FIG. 2A illustrates an example in which the voids 180 are implemented by circular cylinders 210 of removed material, and FIG. 2B illustrates an example in which the voids 180 are implemented by parallel trenches 220 of removed material. The dielectric plugs 190 may have a similar geometry.

The dielectric plugs 190 may be used to reduce or increase the effective, or average, relative dielectric permittivity between the lower metal structure 170 and the upper metal structure 175. The average relative dielectric permittivity may be reduced by forming the dielectric plugs 190 from a dielectric material with a relative dielectric permittivity less than that of the dielectric layer 145, or may be increased by forming the dielectric plugs 190 from a dielectric material with a relative dielectric permittivity greater than that of the dielectric layer 145. In one example that lowers the average relative dielectric permittivity when the dielectric layer 145 is formed from silicon oxide, the dielectric plugs 190 include HSQ or MSQ. In an example that increases the relative dielectric permittivity when the dielectric layer 145 is formed from silicon oxide, the dielectric plugs 190 include SiN. In another example, the dielectric plugs 190 include a "high-k" material, e.g. a dielectric with a relative dielectric permittivity of at least 8, e.g. $Ta_2O_5$, $ZrO_2$ or $HfO_2$.

Figure 3A:
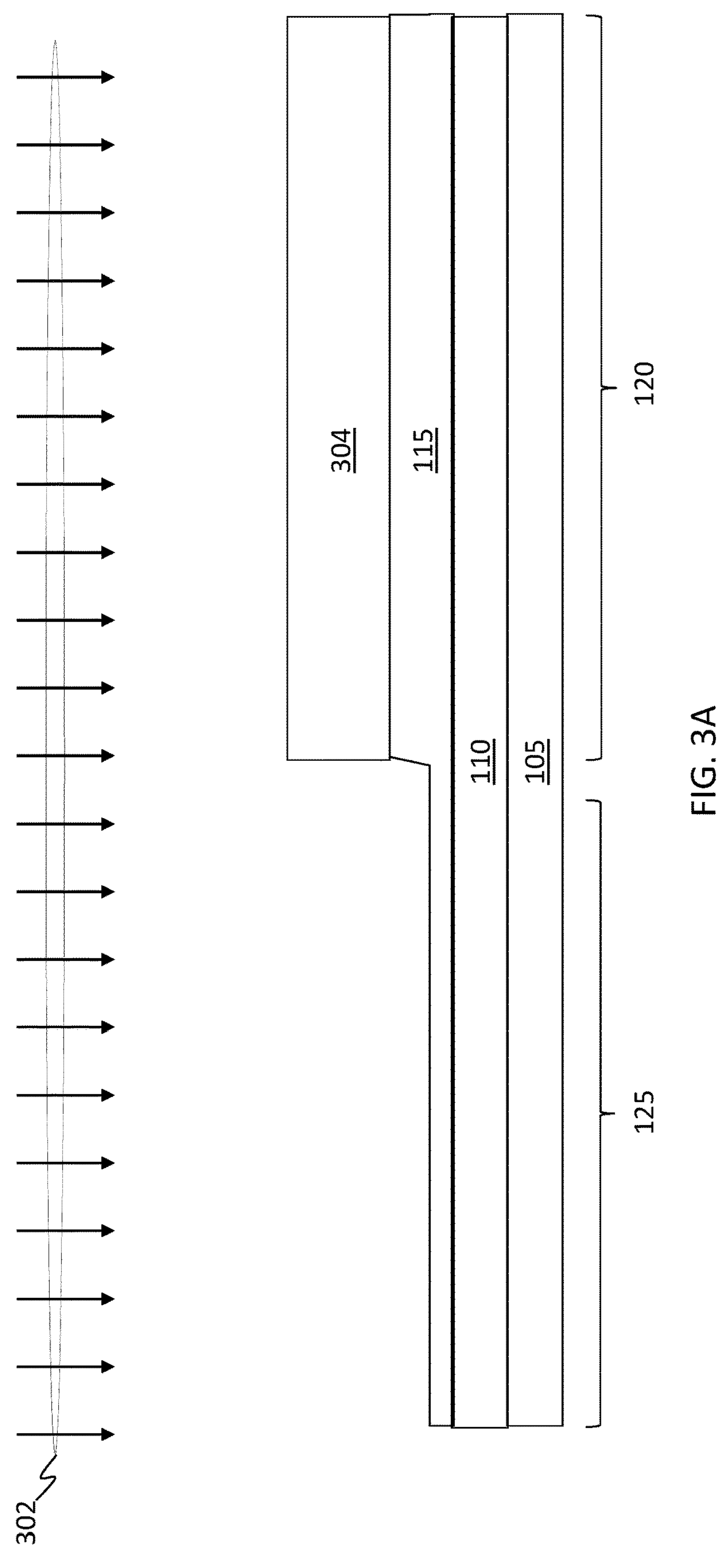

FIG. 3A-3J illustrate various stages of manufacturing the IC 100 according to some examples. Initially, FIG. 3A shows the device 100 after forming the GaN layer 115. A masked etch may be used to selectively remove a portion of an initially planar GaN layer thereby thinning that layer in the isolation area 125. In an optional step, an amorphizing implant 302 is performed in the GaN layer 115 in the isolation area 125, with a mask 304 protecting the device area 120. The implant species may be, for example, Ar, Kr, Xe, or other electrically inactive species. The implant 302 may convert some of the GaN layer 115 in the isolation area 125 from a crystalline form to an amorphous form, thereby reducing the conductivity of the GaN layer 115. In some examples in which the implant 302 is performed the initial planar GaN layer is not thinned in the isolation area 125, such that the GaN layer 115 remains planar.

Figure 3B:
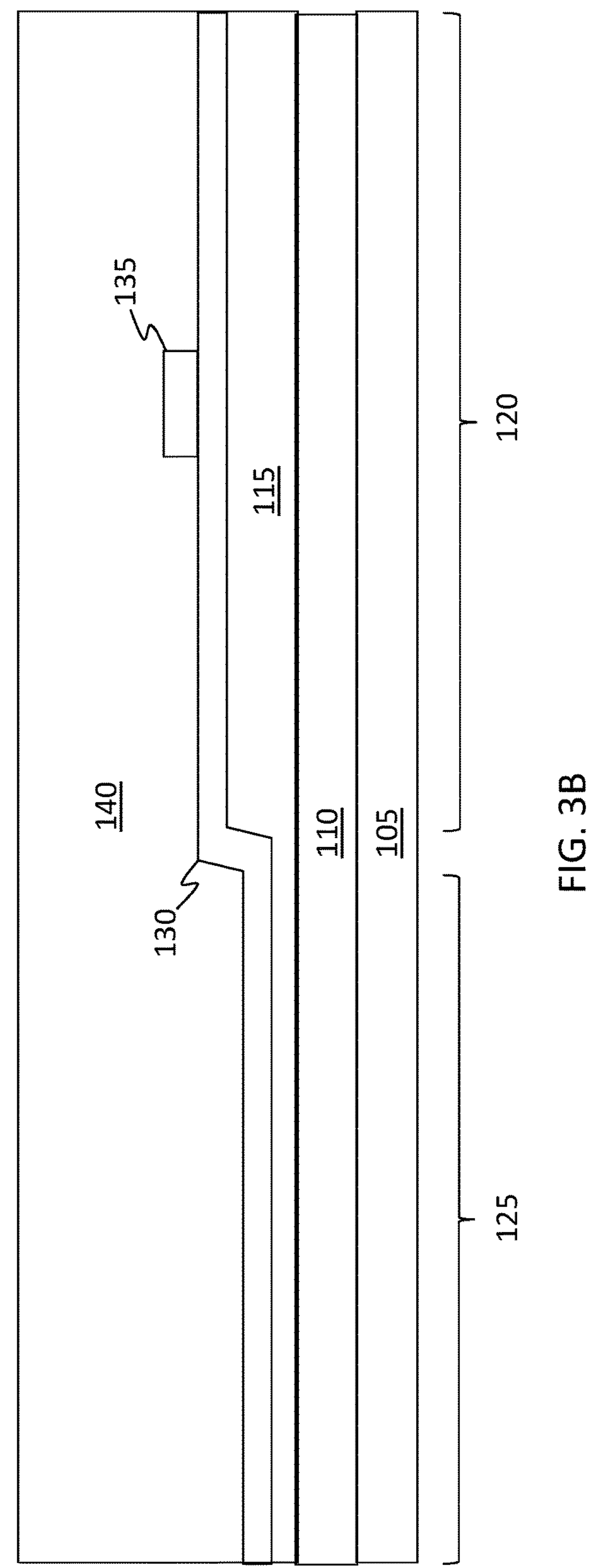

In FIG. 3B shows the device 100 after forming the SiN layers 130 and 140. Optionally the SiN layer 140 is planarized to reduce topography that would otherwise result from the nonplanarity of the GaN layer 115.

Figure 3C:
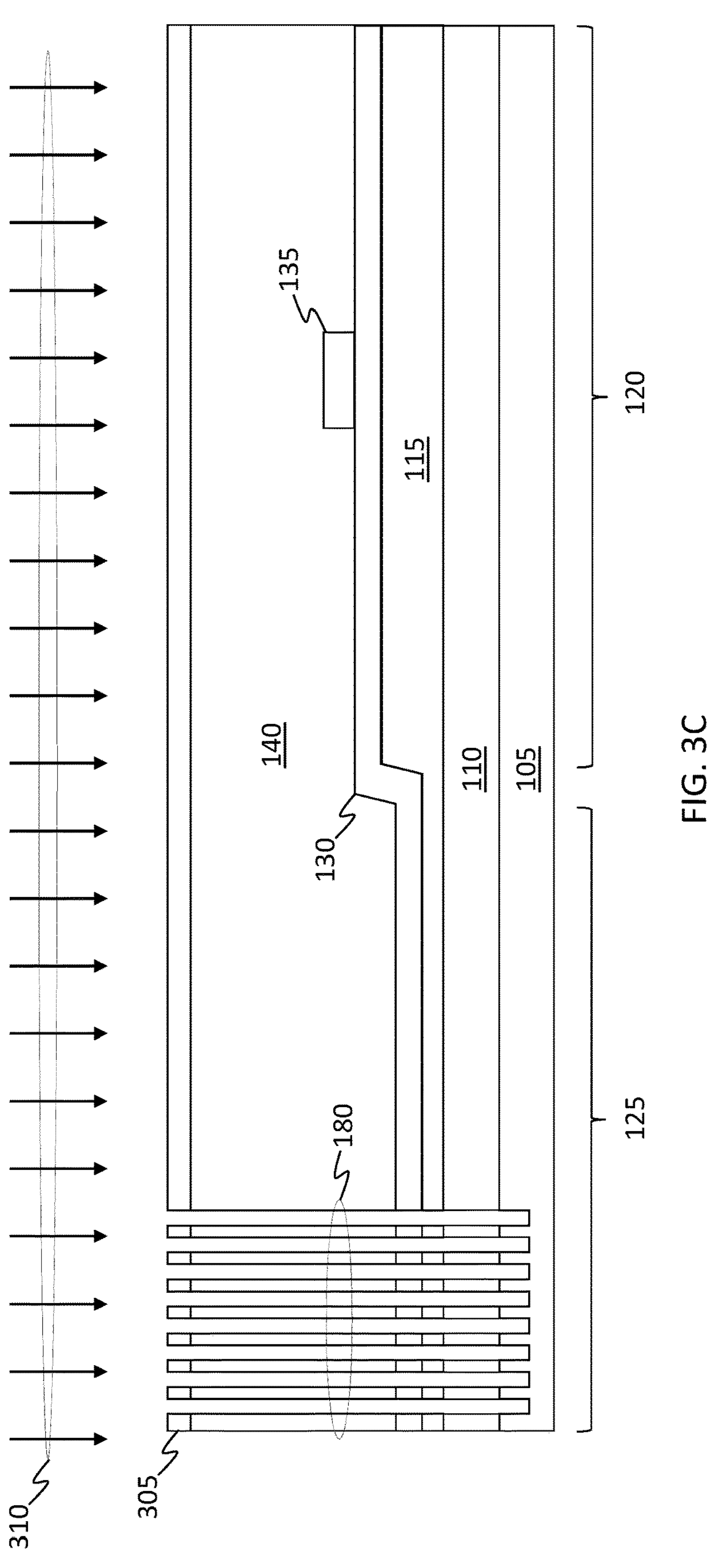

In FIG. 3C, a mask layer 305 has been patterned to expose portions of the SiN layer 140 to a plasma etch process 310. The mask layer 305 may be formed from an organic resist material or an inorganic dielectric material as a hardmask. The etch process 310 is relatively nonselective with respect to the SiN layers 130, 140, the GaN layer 115, the transition layer 110 and the substrate 105. In one example of such an etch process, wafers are placed in downstream plasma reactor with a mixture of gas which could include $CF_4$, $O_2$, and/or $N_2$. In another example, the etch can be accomplished using wet chemicals like hot phosphoric acid. The etch process may be timed or designed to stop on the (possibly silicon) substrate 105, and may include an overetch to ensure removal of a portion of the substrate 105.

Figure 3D:
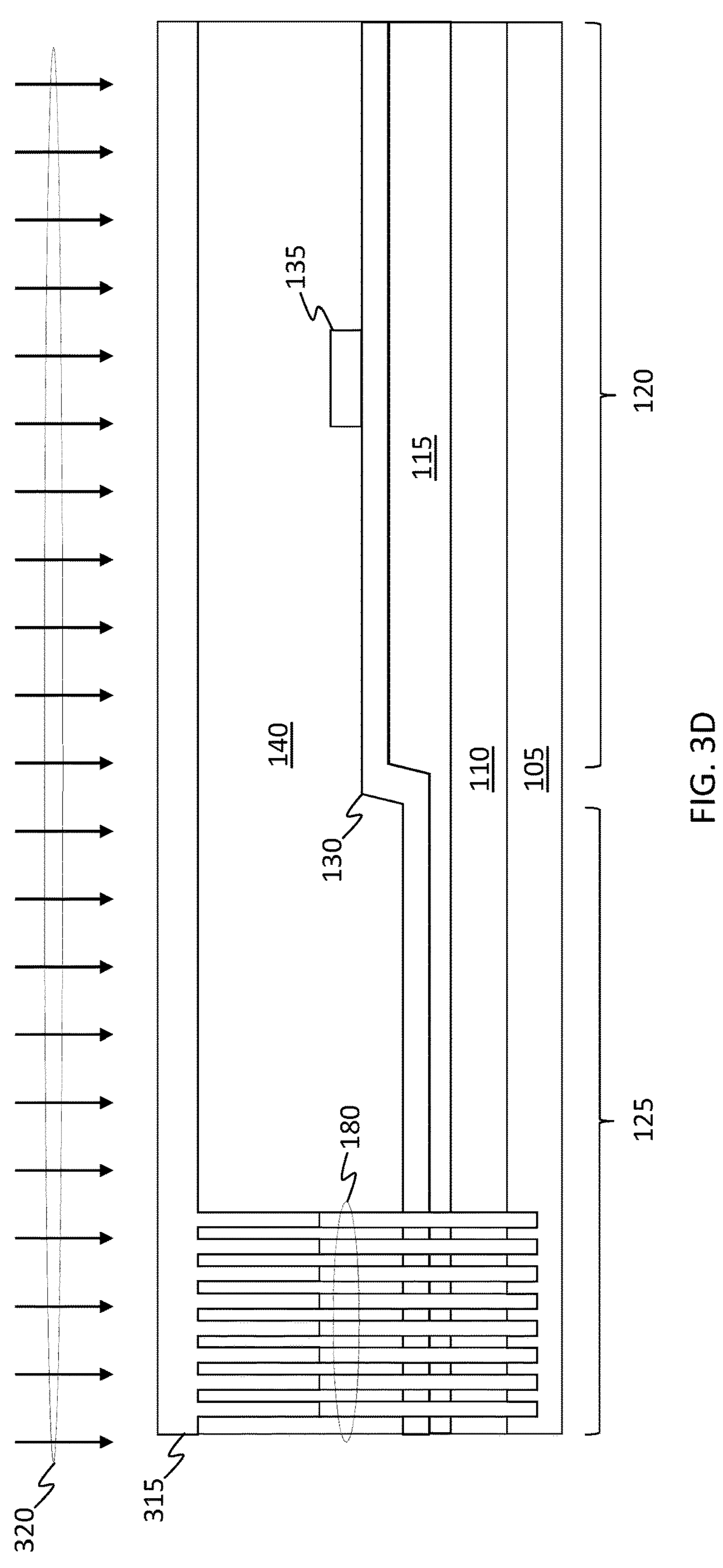

FIG. 3D shows the partially formed IC 100 after the mask layer 305 has been removed. A plug material layer 315 has been formed by a deposition process 320. In examples in which the material layer 315 is a plasma-deposited dielectric layer, the deposition process 320 may be a process such as high-density plasma oxide deposition that results in pinching off the dielectric material within the voids 180, thereby leaving air gaps within the voids 180. In other examples, not shown, the deposition process 320 may be more conformal and fill most or all of the volume of the voids 180. In some other examples the plug material layer 315 includes HSQ or MSQ and the deposition process 320 is a spin-on process. The spin-on process may be tuned to fill more or less of the voids 180, e.g. by selecting an appropriate combination of dispense volume, soak time, ramp time, final RPM and spin time.

Figure 3E:
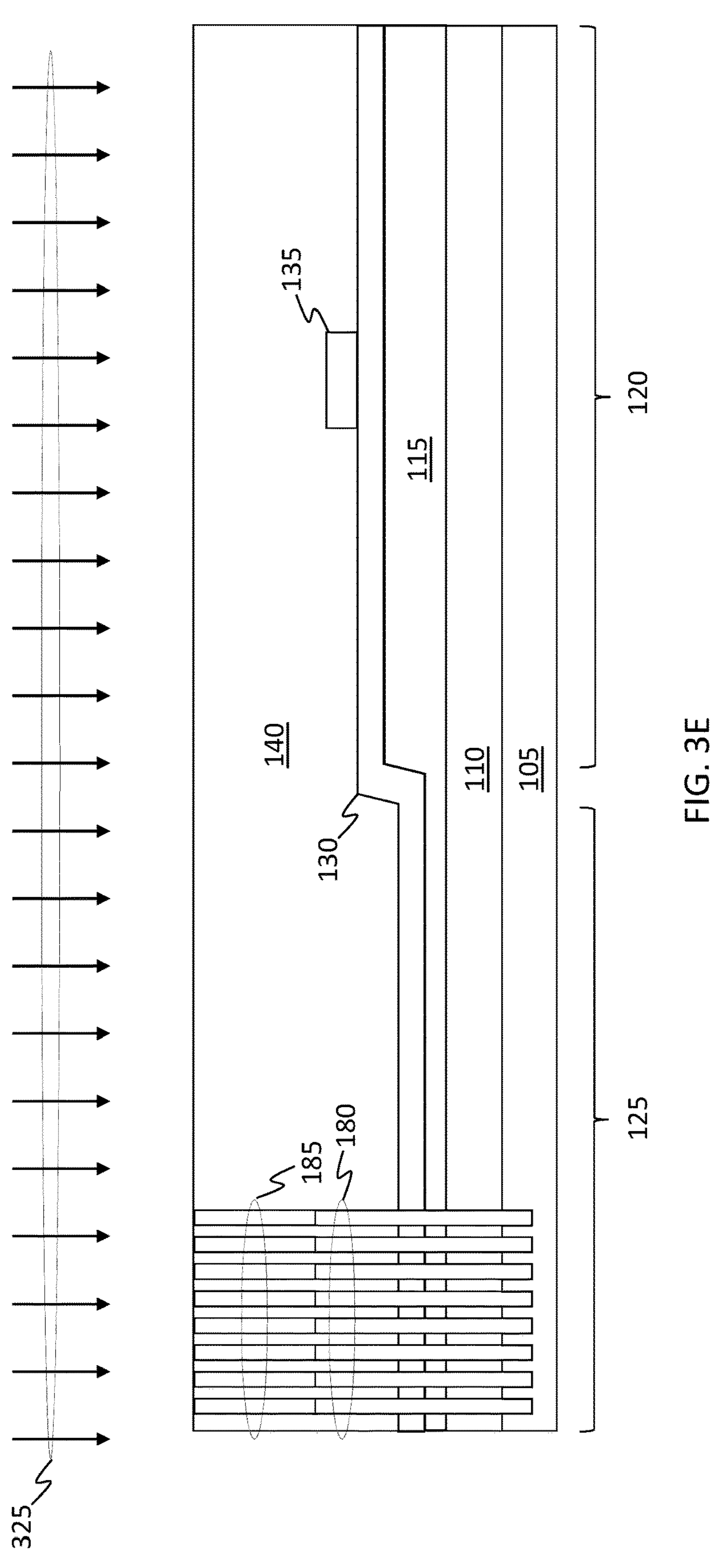

As shown in FIG. 3E, an overburden of the material layer 315 is removed over the SiN 140 by a process 325. The process 325 may be a CMP process or a plasma etch-back process. The process 325 may result in the dielectric plugs 185 being about flush with a top surface of the SiN 140.

FIG. 3F illustrates the partially formed IC 100 after the interconnect 150 and the metal structure 170 have been formed. In some examples, an aluminum layer, possibly alloyed with a few percent copper, is formed over the SiN layer 140 and patterned using a subtractive etch.

Figure 3G:
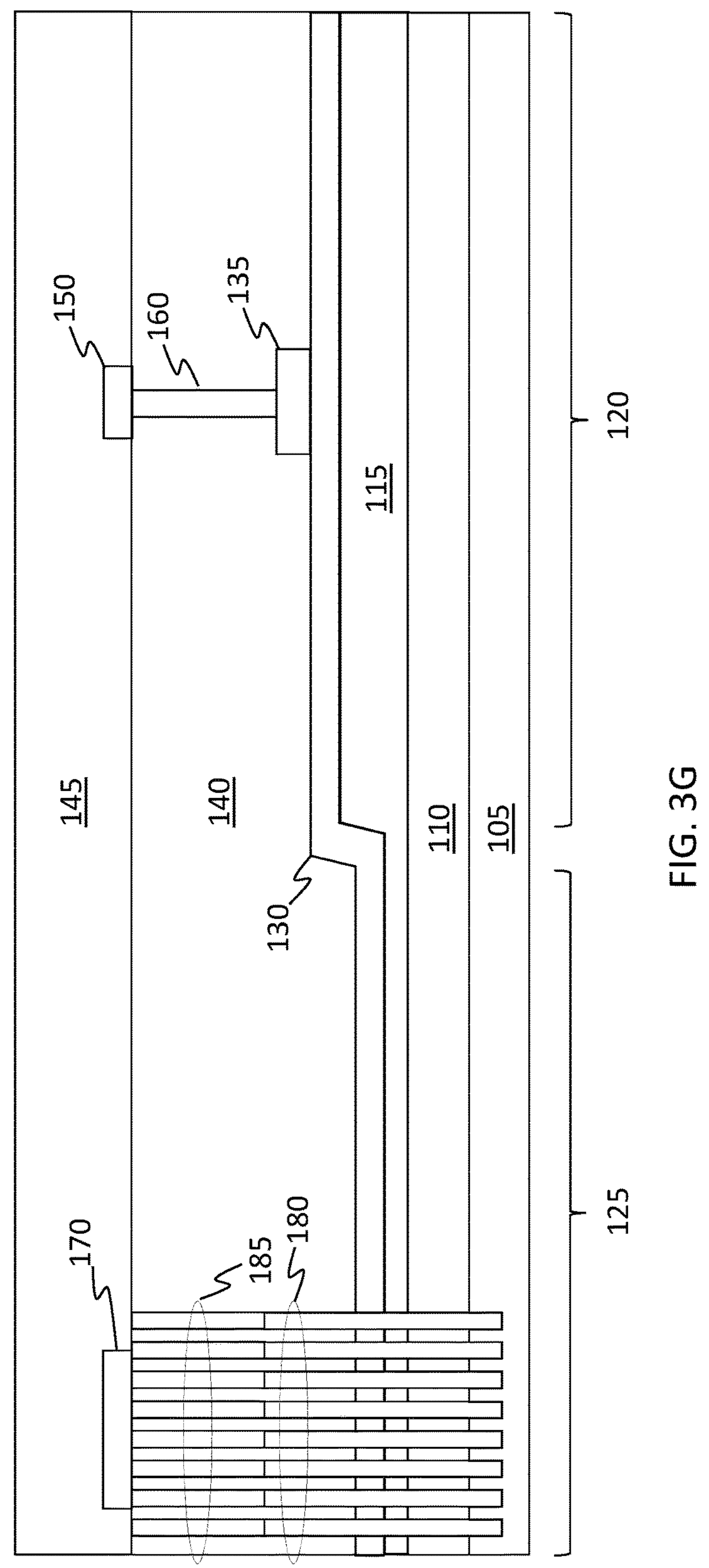

In FIG. 3G the dielectric layer 145 has been formed over the interconnect 150, the metal structure 170 and the SiN layer 140. The dielectric layer 145 may be formed from any desired dielectric material, e.g. plasma-deposited silicon oxide.

Figure 3H:
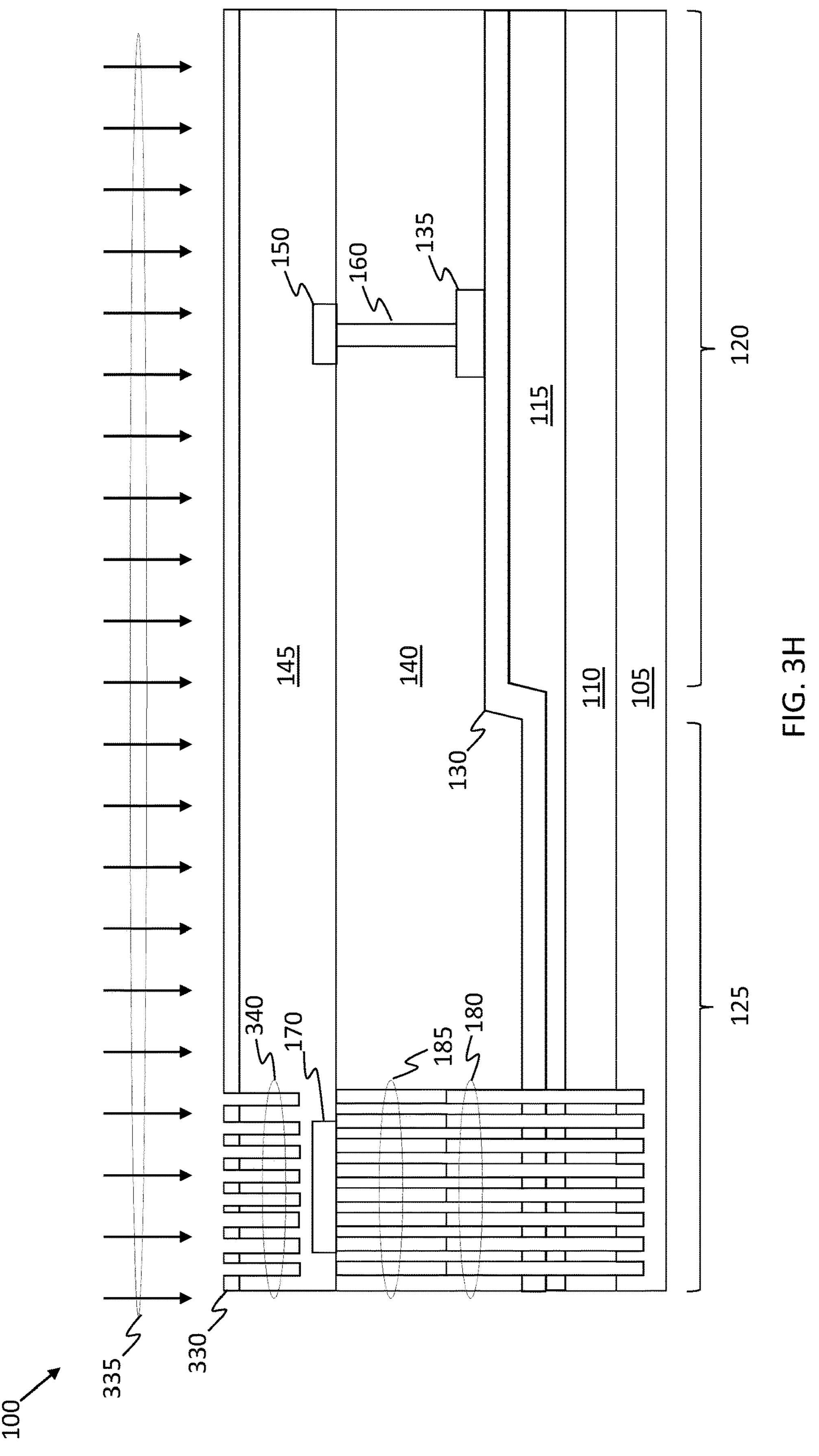

FIG. 3H shows the partially formed IC 100 after a mask layer 330 has been patterned to expose portions of the dielectric layer 145 to a plasma etch process 335. The mask layer 330 may for formed from an organic resist material or an inorganic dielectric material as a hardmask. The etch process 335 may be any process suitable to the material of the dielectric layer 145 and the geometry of the dielectric plugs 190. In various examples the etch process 335 is a fluorocarbon-based silicon oxide plasma etch process. The etch process 335 results in trenches (or holes) 340.

Figure 3I:
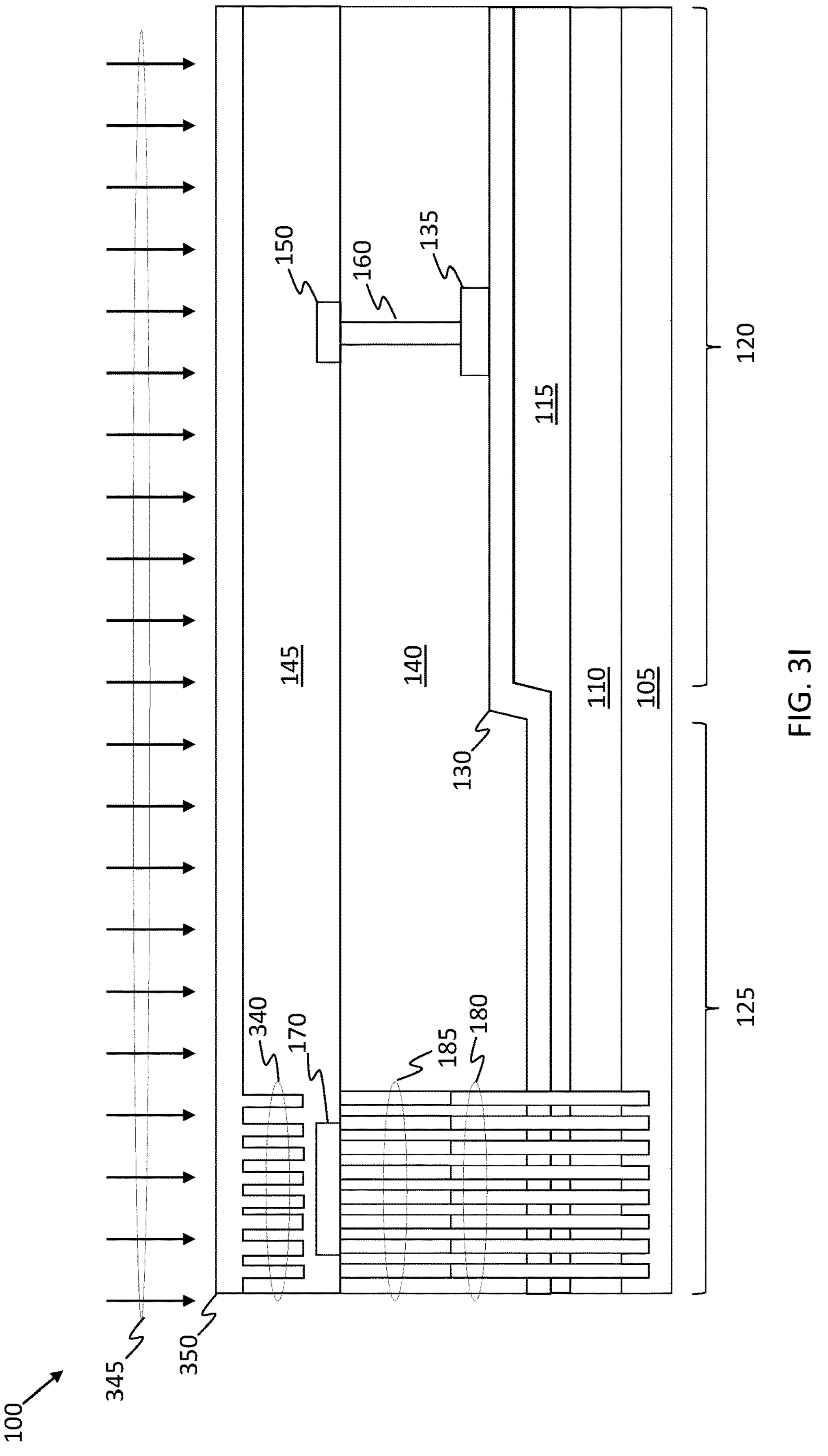

FIG. 3I illustrates the partially formed IC 100 after the mask layer 330 has been removed. A plug material layer 350 has been formed by a deposition process 345. In examples in which the material layer 350 is a plasma-deposited dielectric layer, the deposition process 345 may be a process that completely fills the trenches 340, such as a PECVD silicon oxide deposition followed by a SACVD silicon oxide deposition. In some examples the deposition process 345 may include atomic-layer deposition (ALD) of a high-k dielectric material. In other examples, the plug material layer 350 includes HSQ or MSQ and the deposition process 345 is a spin-on process. The spin-on process may be tuned to fill the trenches 340.

Figure 3J:
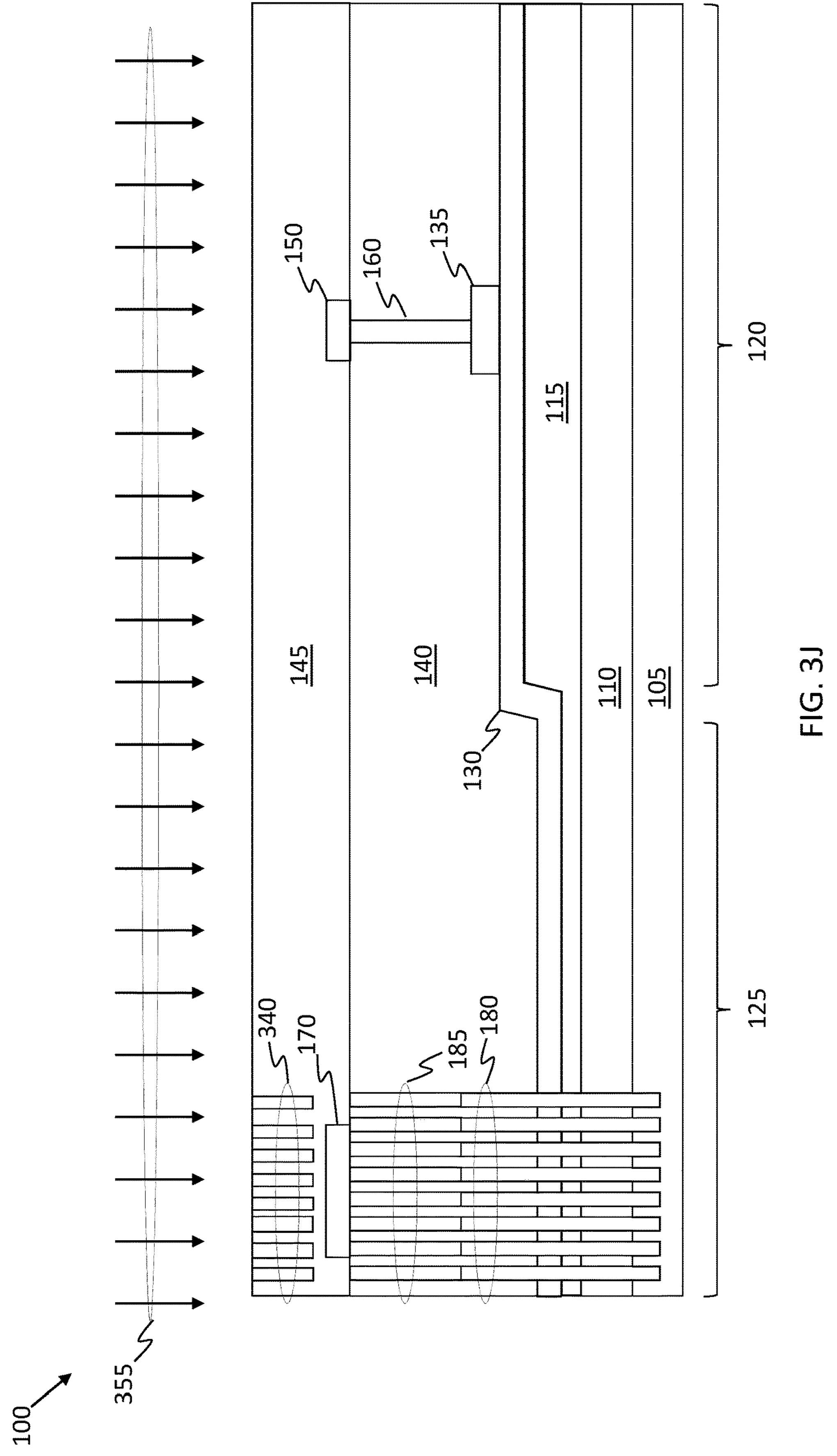

In FIG. 3J, an overburden of the material layer 350 is removed over the dielectric layer 145 by a process 355. The process 355 may be a CMP process or a plasma etch-back process. The process 355 may result in the dielectric plugs 190 being about flush with a top surface of the dielectric layer 145.

Additional processing, not shown, forms the via 160, the second metal level interconnect 155 and the upper metal structure 175, resulting in the device 100 as illustrated in FIG. 1.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A method of forming an integrated circuit, comprising:
forming a GaN layer over a semiconductor substrate;
decreasing conductivity of the GaN layer in a passive device region by amorphizing the GaN layer in the passive device region; and
forming a GaN transistor in an active device region of the GaN layer, the decreasing the conductivity of the GaN layer including:
forming a plurality of first voids in a first dielectric layer that overlies the GaN layer, the first voids extending through the first dielectric layer and into the GaN layer;
filling a top portion of the first voids with a first dielectric filler, while leaving an unfilled lower portion of the first voids;
forming a plurality of second voids in a second dielectric layer that overlies the first dielectric layer; and
filling the second voids with a second dielectric filler.

2. The method of claim 1, wherein the first dielectric layer comprises SiN.

3. The method of claim 2, further comprising forming a passive device between the plurality of first voids and the plurality of second voids.

4. The method of claim 3, wherein the passive device includes an inductive coil.

5. The method of claim 1, wherein the first dielectric filler includes hydrogen-silsesquioxane or methyl-silsesquioxane.

6. The method of claim 1, wherein the first dielectric filler includes a high-density plasma oxide.

7. The method of claim 1, wherein the second dielectric layer includes silicon oxide.

8. The method of claim 1, wherein the second dielectric parallel trenches.

9. The method of claim 1, wherein the first voids include round holes.

10. A method of forming an integrated circuit, comprising:
forming a GaN layer over a semiconductor substrate;
amorphizing the GaN layer in a passive device region;
forming a plurality of first voids in a first dielectric layer that overlies the passive device region, the first voids extending through the first dielectric layer and into the GaN layer;
filling a top portion of the first voids with a first dielectric filler, while leaving an unfilled lower portion of the first voids;
forming a plurality of second voids in a second dielectric layer that overlies the first dielectric layer;
filling the second voids with a second dielectric filler; and
forming a GaN transistor in an active device region of the GaN layer.

11. The method of claim 10, wherein the first dielectric layer comprises SiN.

12. The method of claim 11, further comprising forming a passive device over the plurality of first voids.

13. The method of claim 12, wherein the passive device includes an inductive coil.

14. The method of claim 10, wherein the first dielectric filler includes hydrogen-silsesquioxane or methyl-silsesquioxane.

15. The method of claim 10, wherein the first dielectric filler includes a high-density plasma oxide.

16. The method of claim 10, wherein the second dielectric layer includes silicon oxide.

17. The method of claim 10, wherein the first voids include parallel trenches.

18. The method of claim 10, wherein the first voids include round holes.

* * * * *